(12) United States Patent
Elsherbini et al.

(10) Patent No.: US 11,094,672 B2
(45) Date of Patent: Aug. 17, 2021

(54) COMPOSITE IC CHIPS INCLUDING A CHIPLET EMBEDDED WITHIN METALLIZATION LAYERS OF A HOST IC CHIP

(71) Applicant: Intel Corporation, Santa Clara, CA (US)

(72) Inventors: Adel Elsherbini, Tempe, AZ (US);
Johanna Swan, Scottsdale, AZ (US);
Shawna Liff, Scottsdale, AZ (US);
Patrick Morrow, Portland, OR (US);
Gerald Pasdast, San Jose, CA (US);
Van Le, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/586,145

(22) Filed: Sep. 27, 2019

(65) Prior Publication Data

US 2021/0098422 A1 Apr. 1, 2021

(51) Int. Cl.
*H01L 25/065* (2006.01)
*H01L 23/538* (2006.01)
(Continued)

(52) U.S. Cl.
CPC ...... *H01L 25/0657* (2013.01); *H01L 23/5226* (2013.01); *H01L 23/5389* (2013.01);
(Continued)

(58) Field of Classification Search
CPC ....... H01L 25/0657; H01L 2224/08146; H01L 25/50; H01L 24/08; H01L 24/09; H01L 23/5226; H01L 23/5389; H01L 2224/0912
See application file for complete search history.

(56) References Cited

U.S. PATENT DOCUMENTS 8,584,061 B2 11/2013 Shibata et al.
9,219,042 B2 12/2015 Paek et al.
(Continued)

OTHER PUBLICATIONS

Notice of Allowance for U.S. Appl. No. 16/586,167, dated Jan. 15, 2021.
(Continued)

*Primary Examiner* — Jasmine J Clark
(74) *Attorney, Agent, or Firm* — Green, Howard & Mughal LLP.

(57) ABSTRACT

Composite IC chip including a chiplet embedded within metallization levels of a host IC chip. The chiplet may include a device layer and one or more metallization layers interconnecting passive and/or active devices into chiplet circuitry. The host IC may include a device layer and one or more metallization layers interconnecting passive and/or active devices into host chip circuitry. Features of one of the chiplet metallization layers may be directly bonded to features of one of the host IC metallization layers, interconnecting the two circuitries into a composite circuitry. A dielectric material may be applied over the chiplet. The dielectric and chiplet may be thinned with a planarization process, and additional metallization layers fabricated over the chiplet and host chip, for example to form first level interconnect interfaces. The composite IC chip structure may be assembled into a package substantially as a monolithic IC chip.

20 Claims, 9 Drawing Sheets

(51) Int. Cl.
  *H01L 23/522* (2006.01)
  *H01L 23/00* (2006.01)
  *H01L 25/00* (2006.01)

(52) U.S. Cl.
  CPC .............. *H01L 24/08* (2013.01); *H01L 24/09* (2013.01); *H01L 25/50* (2013.01); *H01L 2224/08146* (2013.01); *H01L 2224/0912* (2013.01)

(56) References Cited

U.S. PATENT DOCUMENTS

| | | | |
|---|---|---|---|
| 9,275,929 B2 | 3/2016 | Liou et al. | |
| 9,324,698 B2 | 4/2016 | Yu et al. | |
| 9,368,479 B2 | 6/2016 | Katkar et al. | |
| 9,418,967 B2 | 8/2016 | Koshiishi et al. | |
| 9,570,399 B2 | 2/2017 | Yang et al. | |
| 9,589,945 B2 | 3/2017 | Jo et al. | |
| 9,978,694 B2 | 5/2018 | Cho et al. | |
| 10,026,715 B2 | 7/2018 | Kume et al. | |
| 10,276,544 B2 | 4/2019 | Matsumoto et al. | |
| 10,347,598 B2 | 7/2019 | Baek et al. | |
| 10,510,650 B2 | 12/2019 | Yu et al. | |
| 2008/0246126 A1 | 10/2008 | Bowles et al. | |
| 2015/0200153 A1 | 7/2015 | Wang et al. | |
| 2017/0207197 A1 | 7/2017 | Yu et al. | |
| 2019/0051612 A1 | 2/2019 | Kim et al. | |
| 2019/0103390 A1 | 4/2019 | Chen et al. | |
| 2019/0393190 A1* | 12/2019 | Delacruz | H01L 24/03 |
| 2020/0185330 A1 | 6/2020 | Yu et al. | |
| 2020/0312774 A1 | 10/2020 | Yu et al. | |
| 2021/0098422 A1 | 4/2021 | Elsherbini et al. | |

OTHER PUBLICATIONS

Non-Final Office Action for U.S. Appl. No. 16/586,158, dated May 5, 2021.

\* cited by examiner

COMPOSITE IC CHIPS INCLUDING A CHIPLET EMBEDDED WITHIN METALLIZATION LAYERS OF A HOST IC CHIP

CROSS REFERENCE TO RELATED APPLICATIONS

This application is related to U.S. patent application Ser. No. 16/586,145, filed on Sep. 27, 2019, entitled "PACKAGED DEVICE WITH A CHIPLET COMPRISING MEMORY RESOURCES", and to U.S. patent application Ser. No. 16/586,145, filed Sep. 27, 2019, entitled "VIAS IN COMPOSITE IC CHIP STRUCTURES".

BACKGROUND

Monolithic integrated circuit (IC) fabrication has restrictions that may limit a final product's performance, and thus different versions of IC integration are being investigated. To date however, these techniques and architectures generally suffer from certain drawbacks such as high cost, lower insertion efficiency, and increased z-height.

Some IC integration techniques are performed at the package level. In electronics manufacturing, IC packaging is a stage of semiconductor device fabrication in which an IC that has been monolithically fabricated on a chip (or die) comprising a semiconducting material is assembled into a "package" that can protect the IC chip from physical damage and support electrical contacts that connect the IC to a scaled host component, such as a printed circuit board. Multiple chips can be assembled, for example, into a multi-chip package (MCP). Such multi-chip packages may advantageously combine IC chips from heterogeneous silicon processes and/or combine small dis-aggregated chips from the same silicon process. However, there are many challenges with integrating multiple IC chips into such a chip-scale unit. For example, MCP packaging depends on connecting the different IC chips through package routing, or through interposer routing. However, such packaging interconnect suffers from latency and energy efficiency limitations. MCP technology is also currently limited to a relatively small number of die-to-die electrical connections (~50-2000 IO/mm of die edge, or about 2 K-80 K connections for an exemplary 10 mm×10 mm die).

Wafer-level stacking is another IC integration technique in which wafers of monolithically fabricated ICs are bonded together. While capable of supporting many more electrical connections (e.g., up to 4 million connections for a 10 mm×10 mm die at 5 µm), wafer-level stacking typically requires IC dies that are substantially the same size (area or footprint), and also suffers compounded yield loss since two dies at a same location within a wafer stack need to be functional. Wafer stacking also typically relies on through substrate vias (TSVs) to support signaling and power between die. TSVs are expensive and have a relatively low density, which can pose a bottleneck in power and/or signal delivery.

Die stacking is another IC integration technique where singulated IC die are stacked after all the metallization layers in the separate IC dies have been completed. Die stacking enables high flexibility since the dies can be individually tested and only known good dies are attached to each other. However, die attach is performed after the thickest chip metallization layers have been fabricated, and such layers do not support very fine pitches. The density of interconnects between the stacked die may therefore be limited. Furthermore, one of the IC chips typically still needs to support TSVs, further limiting interconnect densities across the stack interface.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels are repeated among the figures to indicate corresponding or analogous elements. In the figures.

DETAILED DESCRIPTION OF EXEMPLARY EMBODIMENTS

Figure 1:
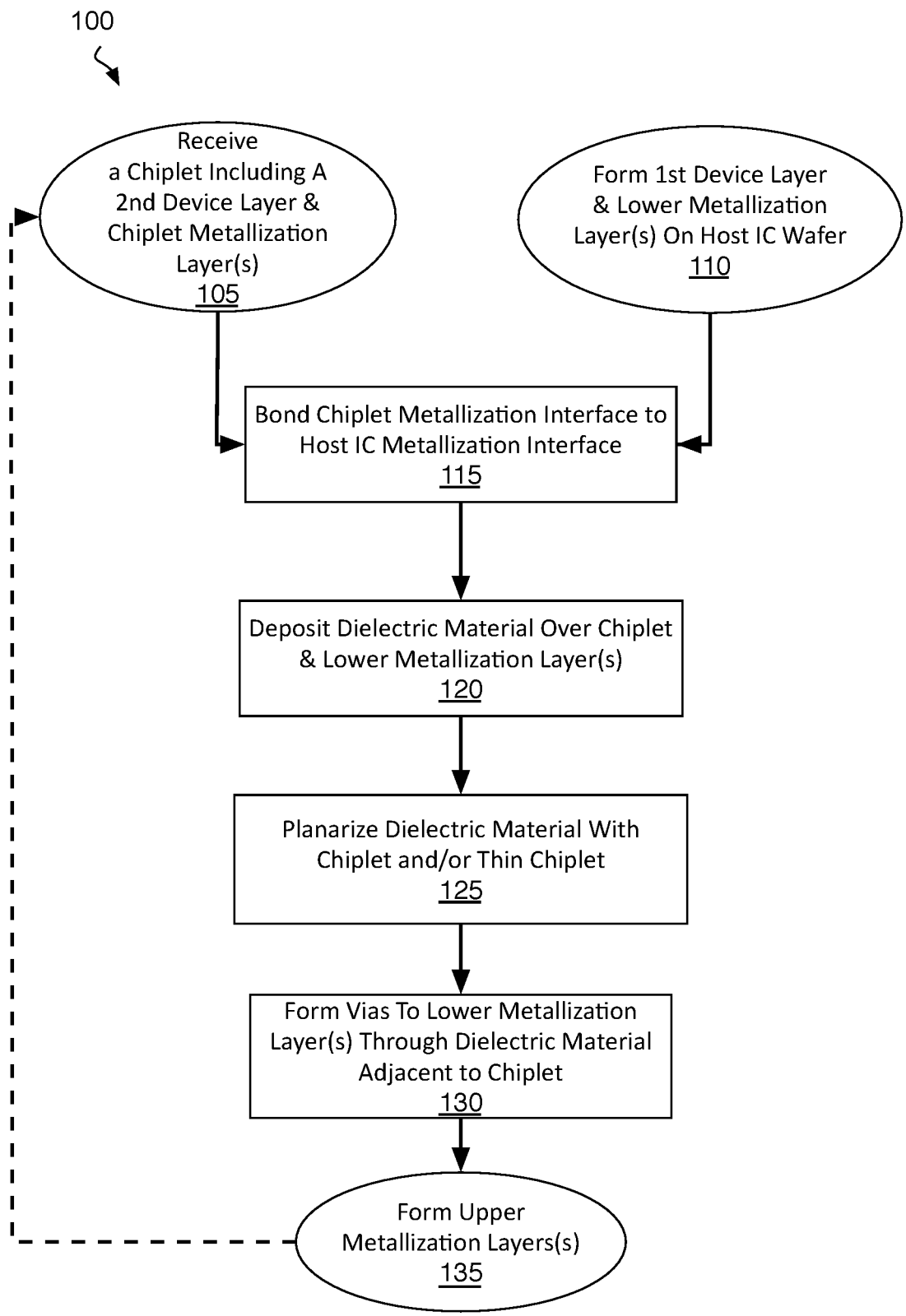
FIG. 1 illustrates a flow diagram of methods for embedding an IC chiplet within back-end metallization layers of a host IC chip, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or functional changes may be made without departing from the scope of claimed subject matter. It should also be noted that directions and references (e.g., up, down, top, bottom, etc.) may be used merely to facilitate the description of features in the drawings and relationship between the features. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with each of the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or structure disposed over or under another may be directly in contact or may have one or more intervening materials. Moreover, one material disposed between two materials may be directly in contact with the two materials or may have one or more intervening materials. In contrast, a first material or structure "on" a second material or structure is in direct contact with that second material/structure. Similar distinctions are to be made in the context of component assemblies where a first component may be "on" or "over" a second component.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Examples of composite, or heterogeneous, IC chips including an IC chiplet that is embedded within back-end-of-line (BEOL) metallization layers of a host IC chip are described below. A "chiplet" or "micro-chiplet" is a singulated die that has a smaller footprint than that of the host IC chip over which the chiplet is embedded. The term "BEOL" generally refers to wafer-level monolithic fabrication operations performed after the formation of the active and passive devices within a device layer during front-end of-line (FEOL) processing. BEOL processing generally entails a series of operations where metal features (metallization) are defined within dielectric material layers to route connections between active devices. BEOL processing generally has feature pitches much smaller than a feature pitch of interconnects that couple an IC chip to some host component (e.g., interposer or package substrate).

The composite IC chips described herein may be manufactured with a hybrid of monolithic and die-level bonding techniques to form one or more of the features or attributes provided in accordance with various embodiments. The chiplet(s) may be partially or fully fabricated in a monolithic process separate from that of the host chip. As such, the chiplet(s) may utilize the same or different semiconductor device technologies as the host chip. An IC chiplet may be attached to the host IC chip at any suitable metallization "layer" or "level" prior to a final metallization layer that is to interface with first level interconnects (FLI) of the composite chip device. Partially or completely fabricated chiplets may be singulated from a wafer, and placed on a host die wafer, for example by a pick-and-place operation at a particular stage of host wafer BEOL metallization. Chiplet attach may comprise a metal feature bonding or metal feature and dielectric (hybrid) bonding.

Functionally, within a composite IC chip one or more chiplets may supplement the function of a host IC chip. A chiplet may, for example, be any of a wireless radio circuit, microprocessor circuit, electronic memory circuit, floating point gate array (FPGA), power management and/or power supply circuitry, or include a MEMS device. In some other examples, a chiplet includes banks of active repeater circuitry to improve host IC interconnects (e.g., network-on-chip architectures). A repeater chiplet may, for example, include a repeater bank supporting 2000+ signals within a chiplet area of 0.4 mm$^2$ (at 10 µm) bonded interconnect pitch. In other examples, a chiplet may include clock generator circuitry or temperature sensing circuitry. In other examples, a chiplet may include one or more electrostatic discharge (ESD) protection circuitry banks in-line with first-level interconnects of the composite chip structure. In still other examples, the chiplet includes a second level of logic circuitry that, along with the host IC, implements 3D circuitry (e.g., mesh network-on-chip architectures).

The feature pitch at the chiplet-to-host interface metallization may absorb chiplet-host alignment imprecision. In some embodiments, one or more chiplets are embedded at lower metallization layers, proximal to a device layer of the host chip. Such an architecture enables higher density interconnection between chiplet and host die as there may be few intervening metallization layers. The metallization layer at which a chiplet may be embedded may be selected to match the metallization layer feature pitch with chiplet alignment capabilities. Hence, as alignment technology improves, a chiplet may be embedded more deeply within the BEOL metallization layers of the host chip, realizing a concomitant increase in the chiplet-host chip interconnect density. Each composite IC chip may be handled substantially as a monolithic die and assembled into a package using standard package assembly tools and/or procedures.

A number of different assembly and/or fabrication methods may be practiced to generate a composite IC chip having one or more of the features or attributes described herein. FIG. 1 illustrates a flow diagram of methods 100 for embedding an IC chiplet within back-end metallization layers of a host IC chip, in accordance with some embodiments. Methods 100 begin at block 105, where chiplets are received as a starting material. Alternatively, chiplets may instead be monolithically fabricated at block 105.

Figure 2:
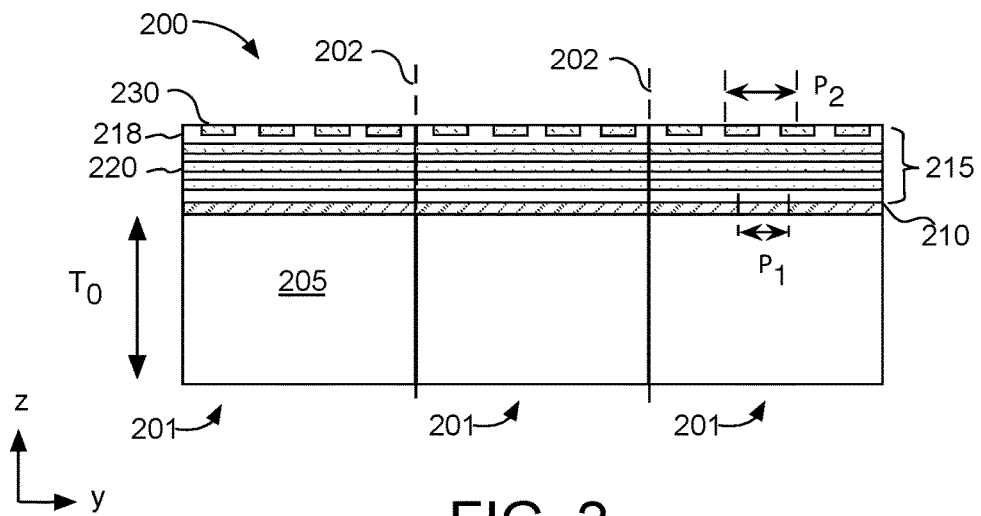
FIG. 2 illustrates a cross-sectional view of a wafer comprising a plurality of IC chiplets, in accordance with some embodiments.

FIG. 2 is a cross-sectional illustration of a chiplet wafer 200 that may be received as a starting material, or fabricated in a first monolithic IC process. Chiplet wafer 200 comprises a plurality of chiplets 201 that are to be singulated along scribe lines 202. Each chiplet 201 includes at least one device layer 210 that is between a substrate 205, and one or more BEOL metallization layers 215 that have been monolithically fabricated over device layer 210. Substrate 205 may be homogenous with device layer 210, or not (e.g., a transferred substrate). In wafer form, substrate 205 may have any thickness $T_0$ sufficient for providing adequate mechanical support during monolithic fabrication of chiplet circuitry. In some exemplary embodiments, thickness $T_0$ is between 200 and 700 μm.

Device layer 210 (and a homogeneous substrate 205) may include any semiconductor material such as, but not limited to, predominantly silicon (e.g., substantially pure Si) material, predominantly germanium (e.g., substantially pure Ge) material, or a compound material comprising a Group IV majority constituent (e.g., SiGe alloys, GeSn alloys). In other embodiments, the semiconductor material is a Group III-V material comprising a Group III majority constituent and a Group IV majority constituent (e.g., InGaAs, GaAs, GaSb, InGaSb). Device layer 210 may have a thickness of 100-1000 nm, for example. Device layer 210 need not be a continuous layer of semiconductor material, but rather may include active regions of semiconductor material surrounded by field regions of isolation dielectric. During front-end-of-line (FEOL) processing, active and/or passive devices are fabricated in chiplet device layer 210 at some device density associated with device pitch $P_1$. In some embodiments, the active devices are field effect transistors (FETs) with a device pitch $P_1$ of 80 nm, or less, for example. The FETs may be of any architecture (e.g., planar, non-planar, single-gate, multi-gate). In some embodiments, FET terminals have a feature pitch of 40-80 nm. Additionally, or in the alternative, chiplet device layer 210 may include active devices other than FETs. For example, chiplet device layer 210 may include electronic memory structures, such as magnetic tunnel junctions (MTJs), or the like. In addition to active devices, or instead of active devices, chiplet device layer 210 may include passive devices (e.g., resistors, capacitors, inductors, etc.).

During back-end-of-line (BEOL) processing, active devices of chiplet device layer 210 are interconnected into chiplet circuitry with one or more chiplet metallization layers 215. In some examples where device layer 210 includes both n-type and p-type FETs, the FETs are interconnected by metallization layers 215 into a CMOS circuit. Metallization layers 215 may comprise any number of conductive layers 220 separated by inter-level dielectric (ILD) material layers 218. Layer thicknesses for both conductive layers 220 and dielectric material layers 218 may range from 50 nm in the lower metallization layers near the interface with device layer 210, to 5 μm, or more, in the upper metallization layers. Conductive layers 220 may have any composition known to be suitable for monolithic integrated circuitry, such as, but not limited to, Cu, Ru, W, Ti, Ta, Co, their alloys, or nitrides. ILD material layer 218 may be of any material composition known to be suitable as an insulator of monolithic integrated circuitry, such as, but not limited to, silicon dioxide, silicon nitride, silicon oxynitride, or a low-k material having a relative permittivity below 3.5. In some embodiments, ILD materials between metallization layers 215 vary in composition with a lower ILD material layer 218 comprising a low-k dielectric material and an uppermost ILD material layer 218 comprising a conventional dielectric material (e.g., having a dielectric constant of approximately 3.5, or more). Confining low-k dielectric materials from a bond interface in this manner may advantageously improve bond strength and/or quality. In other embodiments where low-k dielectric material is able to form a strong bond interface, all ILD material layers 218 may be a low-k material (e.g., having a relative permittivity of 1.5-3.0).

An uppermost one of metallization layers 215 includes conductive features 230, which have an associated chiplet interface feature pitch $P_2$. Conductive features 230 may have any composition and dimension suitable for directly bonding to complementary conductive features of a host IC chip. In exemplary embodiments, chiplet interface feature pitch $P_2$ is larger than feature pitch $P_1$. Chiplet interface feature pitch $P_2$ may range from 100 nm to several microns, for example. Where chiplet 201 includes multiple metallization layers, each metallization layer may have an associated feature pitch that increments up from feature pitch $P_1$ toward feature pitch $P_2$.

Returning to FIG. 1, at block 110 active devices are fabricated in a device layer of a host IC wafer according to any suitable monolithic fabrication technique(s). Alternatively, a partially fabricated host IC wafer is received at block 110 as a starting material. The host IC wafer includes another device layer comprising active and/or passive devices. Devices of the host IC device layer are interconnected into host chip circuitry with one or more lower metallization layers monolithically fabricated over the device layer during BEOL processing of the host wafer.

At block 115, singulated IC chiplets are attached to the host IC wafer. Chiplet attachment may comprise any alignment and bonding process suitable for the chiplet(s). For example, an IC chiplet of a relative large edge size may be handled and aligned to a target location on the host IC wafer according to pick-and-place die assembly methods and systems. Many such methods and systems can handle an object as thin as 50 μm and with edge lengths ranging from tens of millimeters down to ~200 μm. Chiplet attachment at block 115 may also comprise one or more micro device assembly techniques including so-called transfer printing methods, which are capable of handling an object as thin as 1 μm and having lateral dimensions in the tens of micrometers. Such micro device assembly techniques may rely on a MEMS microtool that includes hundreds or even thousands of die attachment points. Micro device assembly methods and systems suitable for inorganic LED (iLED) technology, for example, may be employed at block 115 to transfer a plurality of IC chiplets en masse from a source substrate to the host IC wafer.

The chiplet may be aligned to a target location on the host IC wafer with any high resolution alignment tool, for example of the type found on a wafer-level or chip-level bonding tool commercially available through EVG, SUSS, or TEL, any of which may be employed at block 115. Alignment capability continues to advance, having improved from +/−5 μm to +/−0.2 μm over recent years. Once adequately aligned, the chiplet may be bonded to the host IC wafer with any direct bonding technique(s) suitable for the chiplet and host IC wafer interfaces. Direct bonding may be metal-to-metal, for example, during which metal of a feature in an upper most metallization layer of the chiplet sinters with metal of a feature in an upper most metallization layer of the host IC. In some embodiments, the chiplet is bonded to the host IC wafer through a hybrid bond in which a bond is formed both between metallization features (e.g., via metal interdiffusion) and between dielectric materials (e.g., via Si—O—Si condensation bonds) of the host IC wafer and the chiplet. Thermo-compression bonding may be at low temperature (e.g., below melting temperature of the interconnects, and more specifically below 100° C.). Direct bonding at room temperature (i.e., compression only) is also possible. Prior to bonding, either or both of IC host wafer or chiplet may be pre-processed, for example with a plasma clean, to activate their surfaces for the bonding. Post bonding, selective or mass heating may be performed, to make permanent the bond (e.g., by strengthening the covalent oxide to oxide bond and/or the metallic Cu—Cu bond through interdiffusion). For selective heating, a heat mask or laser heating may be employed to limit the heat to the specific chiplet locations.

Figure 3A:
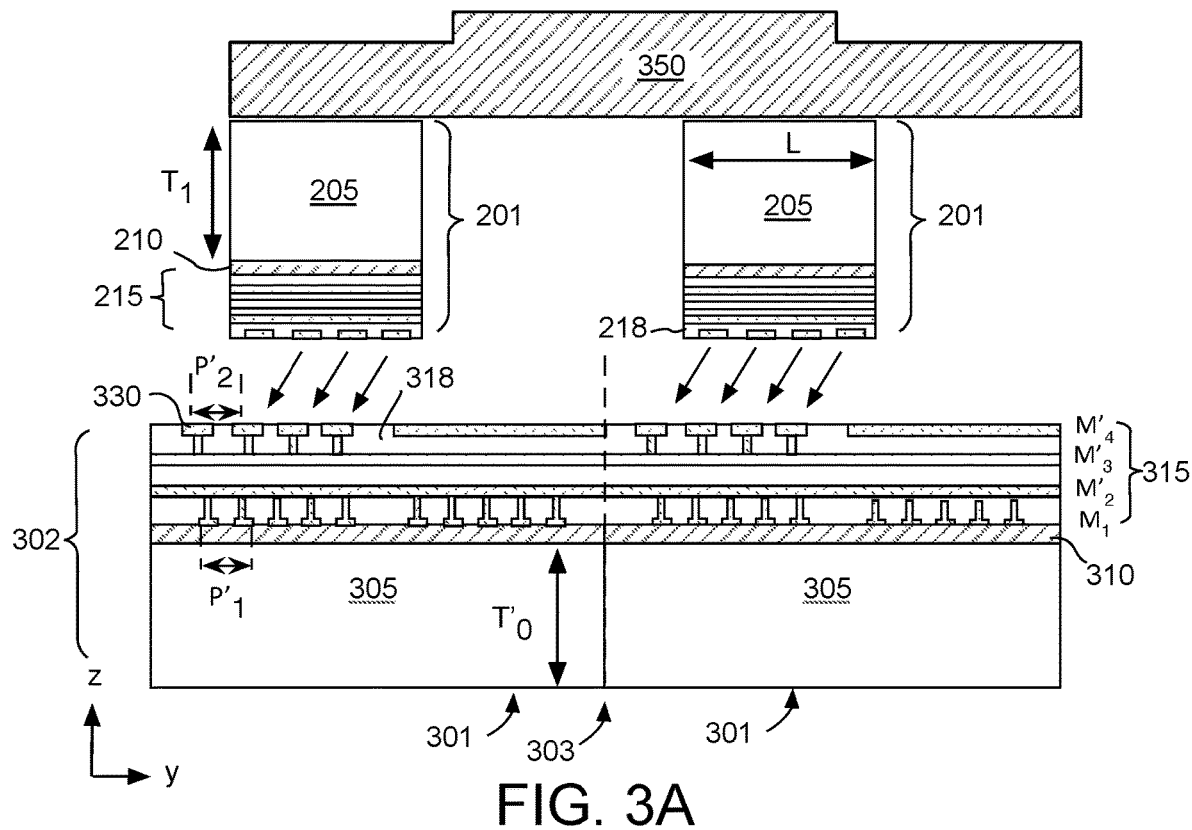
FIGS. 3A, 3B, 3C, 3D, and 3E illustrate cross-sectional views of a composite IC chip structure including a chiplet embedded in back-end metallization layers of a host chip evolving as the methods illustrated in FIG. 1 are practiced, in accordance with some embodiments.

In the example shown in FIG. 3A, following singulation, chiplets 201 are aligned and attached to a host IC wafer 302. Host IC wafer 302 includes a host device layer 310 between a substrate 305 and lower BEOL metallization layers 315. Substrate 305 may be homogenous with device layer 310, or not (e.g., a transferred substrate). In exemplary embodiments, host IC wafer 302 is contiguous across multiple host IC chips 301 with streets 303 demarking where host IC wafer 302 will be subsequently scribed during a singulation process. Alternatively, host IC wafer 302 may be a reconstituted assembly of host IC chips 301 that have been previously singulated. In wafer form, substrate 305 may have any thickness $T'_0$ sufficient for providing adequate mechanical support during monolithic fabrication of host IC circuitry. In some exemplary embodiments, thickness $T'_0$ is between 200 and 700 μm.

In some exemplary embodiments, device layer 310 includes FEOL FETs, which may be of any architecture known to be suitable for a monolithic IC. In some heterogeneous IC embodiments, host IC device layer 310 includes active devices that are different from those of chiplet device layer 210. In one example, FETs of host IC device layer 310 are fabricated with FEOL process technology that differs from that employed to fabricate FETs of chiplet IC device layer 210. Host IC device layer 310 may be silicon-CMOS while chiplet IC device layer 210 is non-silicon (e.g., GaN), or vice versa. Host IC device layer 310 may also comprise active devices other than FETs. For example, host IC device layer 310 may include electronic memory devices, such as magnetic tunnel junction (MTJ) structures, or the like. In another heterogeneous example, active devices of host IC device layer 310 differ from those of chiplet IC device layer 210. Host IC device layer 310 may comprise CMOS logic circuitry while chiplet device layer 210 comprises electronic memory devices, or vice versa.

Device layer 310 (and a homogeneous substrate 305) may include any semiconductor material such as, any of those described for substrate 205 (e.g., substantially pure Si, Ge, SiGe, InGaAs, GaN). Device layer 310 may have any thickness and need not be a continuous layer of semiconductor material, but rather may include active regions of semiconductor material surrounded by field regions of isolation dielectric. During front-end-of-line (FEOL) processing, active devices are fabricated in host IC device layer 310 at some device density associated with device pitch $P'_1$. In some embodiments, the active devices are field effect transistors (FETs) with a device pitch of $P'_1$ 80 nm, or less. For example, transistor terminals may have a feature pitch of 40-80 nm.

Active devices of host IC device layer 310 are interconnected into chiplet circuitry with one or more lower metallization layers 315. In the example illustrated, lower metallization layers 315 include four BEOL metallization layers ($M'_1$-$M'_4$). Lower metallization layers 315 may comprise any number of conductive layers separated by inter-level dielectric (ILD) material layers 318 with material compositions and layer thicknesses being substantially the same as, or at least similar to, those described for chiplet metallization layers 215. In some embodiments, ILD materials between metallization layers 315 vary in composition with lower ILD material layers 318 comprising a low-k dielectric material and an uppermost one of ILD material layers 318 comprising a conventional dielectric material (e.g., having a dielectric constant of approximately 3.5, or more) to confine low-k dielectric materials from the bond interface. In other embodiments where low-k dielectric materials provide high bond strength, all ILD material layers 318 may be low-k dielectric material(s).

An uppermost one of lower metallization layers 315 includes conductive features 330 having an associated host IC interface feature pitch $P'_2$. In exemplary embodiments, host IC interface feature pitch $P'_2$ is larger than active device feature pitch $P'_1$. Host IC interface feature pitch $P'_2$ is advantageously compatible (e.g., substantially the same as, or an integer multiple of) chiplet interface feature pitch $P_2$. Hence, $P'_2$ may range from 100 nm to several microns with each of the lower metallization layers 315 having an associated feature pitch that increments up from pitch $P'_1$ toward feature pitch $P'_2$. Lower metallization layers 315 may have any intermediate feature pitches (e.g., increasing with each additional metallization layer).

As further shown in FIG. 3A, multiple chiplets 201 are reconstituted upon a pick-and-place microtool 350 at a chiplet pitch suitable for transferring multiple chiplets 201 concurrently to host IC wafer 302. In some embodiments, each IC chiplet 201 has an edge length L of 1 mm, or more, with 1-5 μm of error attributable to die scribe. Chiplets of micron lateral dimensions are also possible. Hence, each IC chiplet 201 may have an area that varies widely (e.g., 0.25-50 mm²). During transfer, a backside of substrate 205 is temporarily affixed to microtool 350 and conductive features 230 are brought into alignment with, and into contact with, conductive features 330. In this "flipped chiplet" configuration, a direct bond is formed between conductive features 230 and corresponding ones of conductive features 330. The electrically conductive metal-metal bond at the interface of the chiplet and host IC is limited in area to the overlapping portions of conductive features 230 and 330.

Figure 3B:
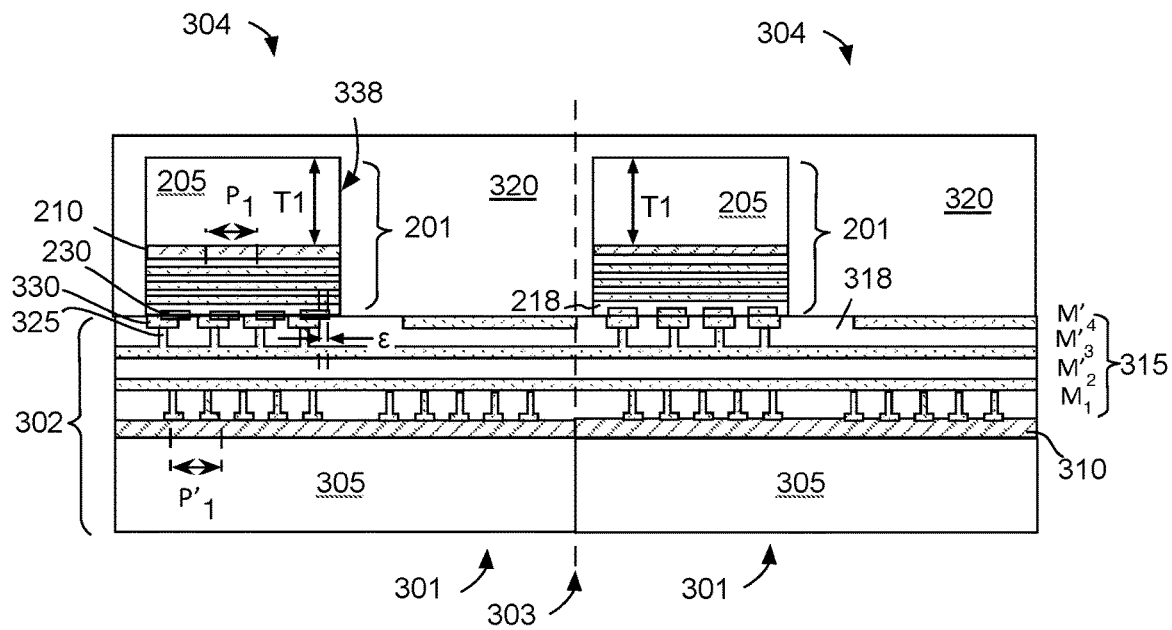

FIG. 3B further illustrates a composite IC chip 304, which includes chiplet 201 bonded within a region of host IC wafer 302 corresponding to one host IC chip 301. Although in the illustrated example there is a 1:1 correspondence between chiplet and host IC chip, any number of chiplets may be bonded to a single host IC chip as a function of the chip and chiplet footprints and/or other architecture objectives. In exemplary embodiments, placement accuracy results in a lateral overlap over the majority of the area of the smallest of conductive feature 230 or 330. In some embodiments, lateral (e.g., x-axis) misalignment or misregistration ε between conductive features 230 and 330 is less than 0.2 μm. While lateral misalignment ε will continue to decrease as the art advances, it may remain larger than misregistration between successive lithographically defined BEOL metallization layers. For example, lateral misalignment between conductive features 330 (e.g., lines or traces) and an underlying conductive feature 325 (e.g., a via) may be at least an order of magnitude smaller than lateral misalignment ε between bonded conductive features 230, 330. For embodiments, where conductive features 230 and/or 330 comprise a metal (e.g., Cu) that might diffuse into adjacent dielectric material as a result of misalignment ε, features 230 and/or 330 may further comprise one or more diffusion barriers (e.g., TaN, TiN, etc.) to mitigate that risk. Such diffusion barriers may be different (e.g., more extensive) than those employed in other metallization layers that are distal from the chiplet-host bond interface and don't have the same degree of misregistration.

With conductive features 230 and 330 having compatible feature pitches $P_2$, $P'_2$, respectively, chiplets 201 and host IC wafer 302 form circuitry that has a minimum feature size and/or pitch peaking at some maximum value at the bond interface and monotonically decreasing from the bond interface toward device layer 210 and toward device layer 310. Hence, chiplet device feature pitch $P_1$ may be smaller than the conductive feature pitch $P'_2$ where conductive feature $P'_2$ is substantially equal to feature pitch $P_2$. Depending on the degree of similarity between the fabrication technologies employed for chiplet 201 and host IC wafer 302, chiplet device feature pitch $P_1$ may be larger than, less than, or substantially equal to host IC device feature pitch $P'_1$. In the illustrated embodiment where both chiplet 201 and host IC wafer 302 includes the same number of metallization layers (e.g., four), feature pitches $P_1$ and $P'_1$ may be substantially equal and the feature pitch variation in the metallization layers between device layers 210 and 310 may be substantially symmetrical about the bond interface between conductive features 230 and 330.

Returning to FIG. 1, methods 100 continue at block 120 where a dielectric material is deposited over the chiplet and over any portion of the host IC not covered by the host chiplet. The dielectric material applied at block 120 is to planarize over the chiplet, enabling subsequent continuation of monolithic BEOL metallization processes. Dielectric material applied at block 120 therefore substantially backfills portions of the host IC where no chiplet is present. Noting that the chiplet may be thick at this point (e.g., 200 μm, or more), multiple dielectric layers may be deposited and/or the dielectric material composition(s) and/or the dielectric material application technique(s) may be selected to achieve layer thicknesses significantly greater than those of a typical BEOL ILD layer. The deposited dielectric material may be planarized at block 125 with grind and/or polish process that is further suitable for thinning the chiplet. The grind/polish may advantageously expose a backside of the chiplet and the chiplet may be thinned by continuing the grind/polish until chiplet substrate thickness has been reduced by some predetermined amount that will achieve sufficient planarity at the level of the host IC wafer to permit the continuation of photolithographic patterning techniques typical of monolithic BEOL metallization processes.

Referring further to the example shown in FIG. 3B, a dielectric material 320 is over chiplets 201, covering a backside of substrates 205. Dielectric material 320 may encapsulate chiplets 201 and backfill regions over lower metallization layers 315 beyond the chiplet sidewall 338 to provide a planar base for subsequent BEOL metallization layers. Although a single dielectric material 320 is shown, multiple dielectric material layers may be applied over chiplets 201. For example, a first conformal dielectric material layer may be deposited to contact chiplet sidewall 338 and a non-conformal, planarizing dielectric material layer may then be deposited over the conformal dielectric material layer. In some embodiments, dielectric material 320 comprises one or more inorganic dielectric materials such as, but not limited to, silicon oxides (B/PSG, carbon-doped silicon oxide), silicon oxynitride, or silicon nitride. In some other embodiments, dielectric material 320 comprises one or more organic materials such as, but not limited to, an epoxy resin, polyimide, or SU-8. At least one dielectric material 320 may be applied, for example, with a spin-on technique or and/or a sol-gel technique to substantially cover chiplet 201.

Figure 3C:
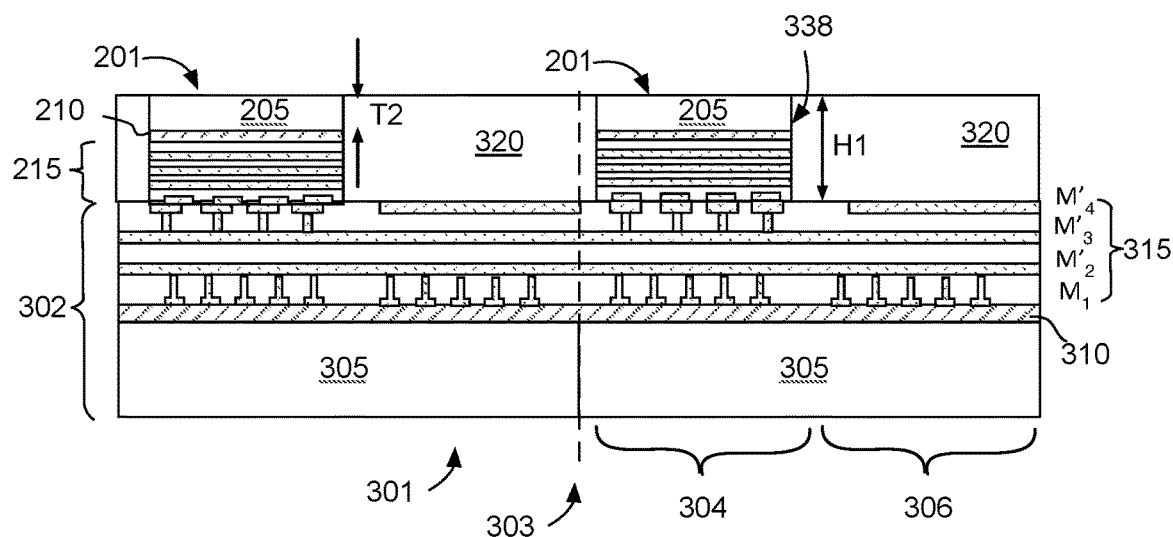

FIG. 3C further illustrates planarization of dielectric material 320 with thinning of substrate 205 from the back side surface, reducing thickness $T_1$ to a significantly smaller thickness $T_2$. In some embodiments where thickness $T_1$ was over 200 μm, for example, thickness $T_2$ is less than 100 μm (e.g., 20-80 μm). Thickness $T_2$ may be as little as a few microns as limited by variation in chiplet bond heights and other sources of non-planarity across host IC wafer 302 as well as the impacts of mechanical stress on the devices, and thermal spreading considerations. With chiplet 201 over a host IC region 304, dielectric material 320 remains only adjacent to chiplet sidewall 338, and over host IC region 306 where chiplet 201 is absent. At this point, chiplet 201 (and dielectric material 320) will have some nominal z-height $H_1$ that may be less than 100 μm (e.g., 20-80 μm). Minimizing thickness $T_2$ has advantages with respect to forming interconnects to the host IC through z-height $H_1$, for example.

Returning to FIG. 1, methods 100 continue at block 130 where electrical connections to the host IC are formed through the dielectric material adjacent to the bonded chiplet. In exemplary embodiments, these electrical connections comprise conductive vias that extend through the thickness of the planarized dielectric material adjacent to the bonded chiplet. The conductive vias may be fabricated according to any suitable BEOL wafer-level processes. For example, any suitable photosensitive mask material may be deposited over the bonded chiplet, and over the adjacent dielectric material. A lithographic process may be utilized to pattern a via mask, and an anisotropic plasma etch performed to transfer the via mask pattern through the planarized dielectric material adjacent to the bonded chiplet. Upon exposing features in an uppermost one of the lower metallization layers of the host IC, the via openings may be filled with conductive material (e.g., a metal such as Cu) and the conductive material planarized with a surface of the chiplet and the dielectric material.

Figure 3D:
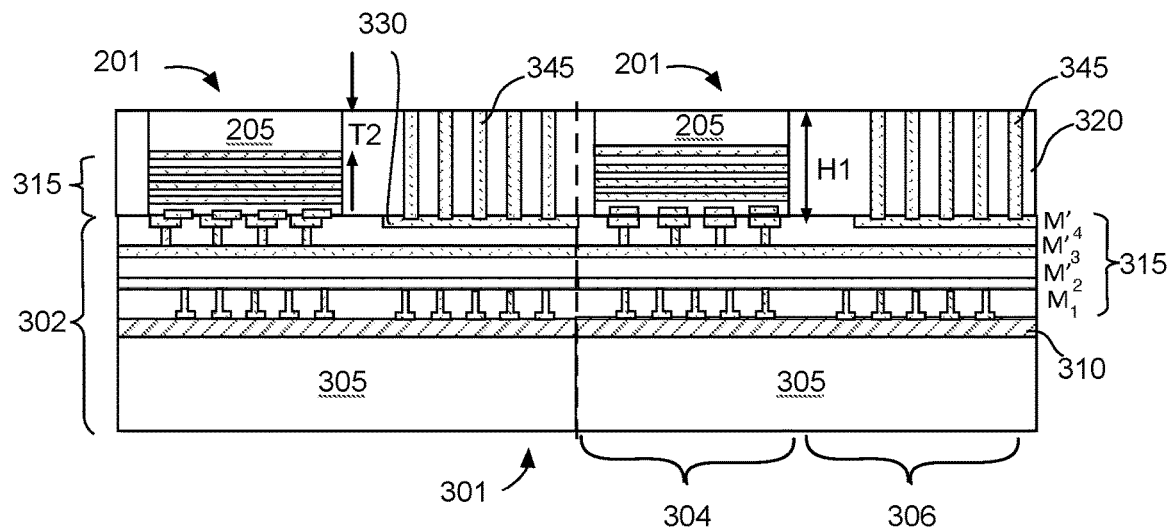

In the example illustrated in FIG. 3D, conductive vias 345 have been formed through dielectric material 320. Conductive vias 345 intersect conductive features 330 of the $M'_4$ host IC metallization layer. Conductive vias 345 are therefore similar to any upper layer (e.g., layer 5) BEOL conductive via although conductive vias 345 are scaled as needed to accommodate z-height $H_1$ associated with chiplet 201 and to maintain a reasonable via aspect ratio (e.g., 7:1). Hence, as noted above, minimizing thickness $T_2$ allows conductive vias 345 to have a finer pitch for a higher density of connections to host IC metallization layers 315. Where conductive vias 345 may have finer pitches, chiplet 201 may be embedded at a lower level of metallization layers 315. Noting that many connections at higher levels of BEOL metallization are power supply connections, conductive vias 345 may be sized appropriately to support high currents that are to be provided to lower metallization layers 315 which may further route power and signal I/O of both chiplet 201 and host chip 301.

Returning to FIG. 1, methods 100 continue at block 135 where upper BEOL metallization layers are formed according to any fabrication processes and architectures known to be suitable for an IC. Operations performed at block 135 may be any of a standard BEOL process (e.g., damascene patterning, metal plating, and planarization) because the bonded chiplet is at this point substantially embedded within a lower BEOL dielectric layer that has been substantially planarized. In exemplary embodiments, at least one upper metallization layer is formed over the chiplet, and any number of upper metallization layers may be formed at block 135 as a function of the complexity of the composite IC chip circuitry. Conductive features in the upper metallization layers are electrically coupled to at least the conductive vias formed at block 130. In some embodiments, the upper metallization layers include features (traces or vias) that are located over both the embedded chiplet and portions of the host IC chip beyond edges of the chiplet. Hence, the upper metallization layers may extend over substantially the same footprint as the lower metallization layers of the host IC with only one via layer having a keep-out zone associated with an embedded chiplet.

Figure 3E:
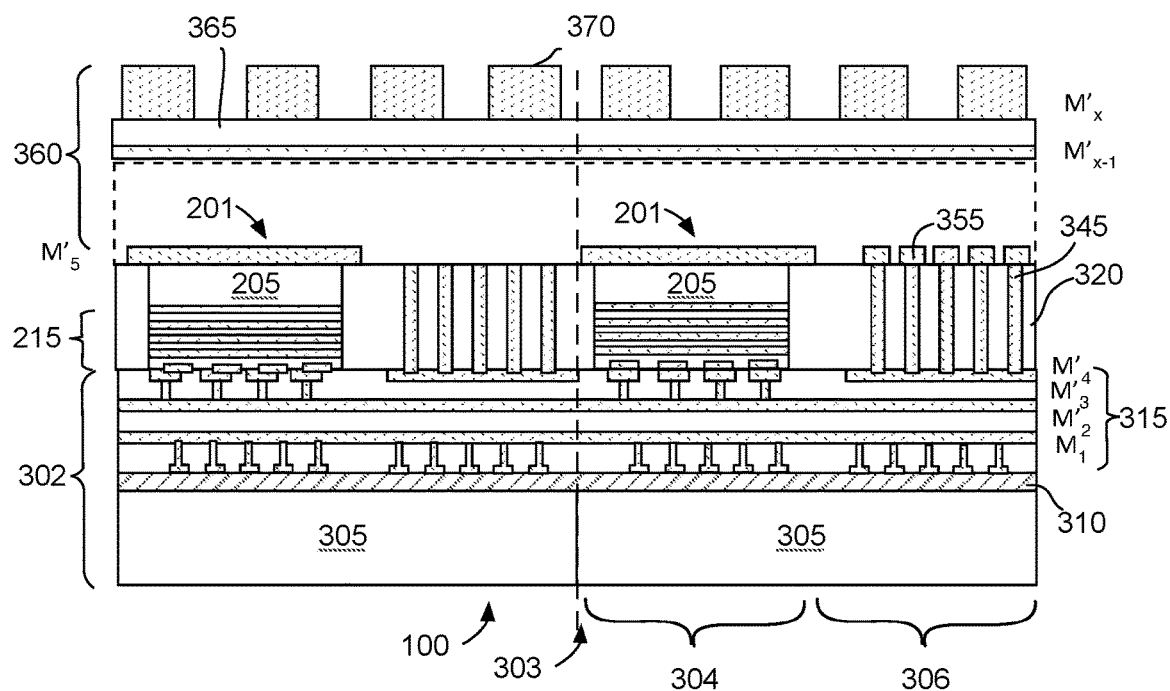

In the example further illustrated in FIG. 3E, upper metallization layers 360 include a lowest upper metallization layer 355 ($M'_5$) in contact with conductive vias 345. Upper metallization layer 360 may further include any number of ILD layers and additional metallization layers, as denoted by dash lines. Upper metallization layers 360 include a top metallization layer ($M'_x$) that includes a plurality of FLI interface features 370 (e.g., pillars, pads, etc.) that are suitable for solder-based bonding (e.g., microbumps, etc.) or direct bonding to FLI interface features of a host (not depicted). Upon forming the FLI interface features 370, wafer 302 may be singulated along street 303 to arrive at a discrete composite chip structure 401 further depicted in FIG. 4.

Figure 4:
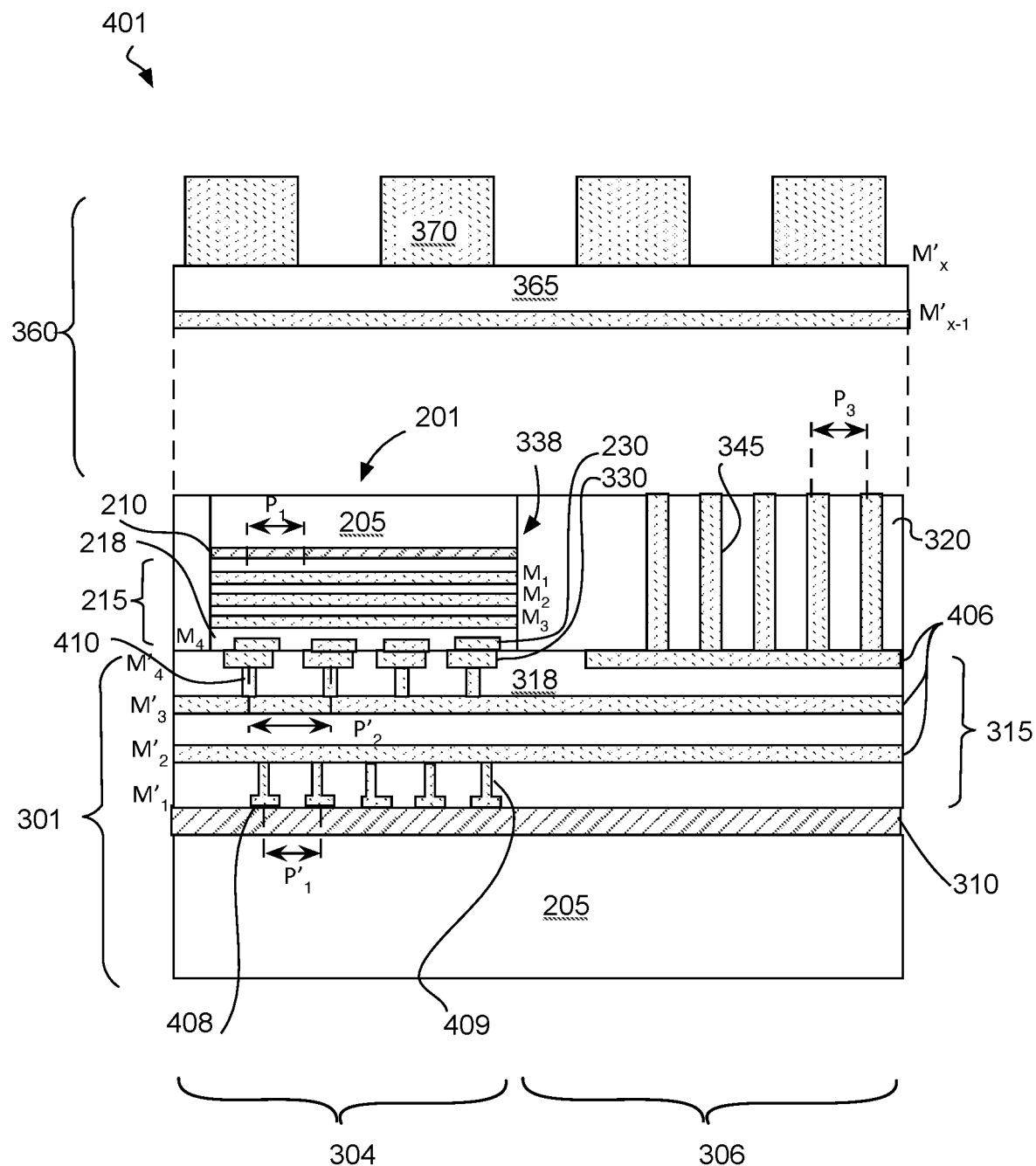
FIGS. 4 and 5 illustrate cross-sectional views of composite IC chip structures including a chiplet embedded in back-end metallization layers of a host chip, in accordance with some embodiments.

As shown in FIG. 4, composite chip structure 401 includes chiplet 201 embedded within BEOL metallization layers of host IC chip 301. Chiplet 201 is between upper metallization layers 360 that include FLI interface features 370, and lower metallization layers 315. With the inclusion of chiplet 201, composite chip structure 401 has distinct regions 304 and 306 delineated by chiplet sidewall 338. One or more dielectric material layers may encapsulate chiplet 201, being in contact with chiplet sidewall 338.

Conductive vias 345 extend through dielectric material 320 and electrically coupled upper metallization layers 360 with lower metallization layers 315. Power supplied through FLI interfaces 370 may be routed through conductive vias 345 to either or both metallization layers 215 and 315, and to active devices within either or both of device layers 210 and 310. Top metallization layers 360 including a plurality of FLI interfaces 370 extend over both regions 304 and 306 (i.e., spanning the footprint of host IC chip 301). Lower metallization layers 315 may also span both region 304 under chiplet 201, and region 306 under chiplet 201. Lower metallization layers 315 and chiplet metallization layers 215 are interconnected at a bonded electrical interface between conductive features 230 and 330 that have overlapping areas that are in direct contact. Conductive features 230 and 330 may have some nominal misregistration that is shared across the entire region 304. Interfaces between lower metallization layers 315 and conductive vias 345 are non-bonded. Conductive vias 345 within region 306 may have a misregistration to features of metallization layers 315 that is significantly less than the nominal misregistration within region 304.

Dielectric materials 318 and 218 are in direct contact and may provide the majority of mechanical bond strength between chiplet 201 and host IC chip 301. Lower metallization layers 315 comprise a first lower metallization layer (e.g., $M'_1$) having a first metallization feature pitch (e.g., the same or somewhat larger than active device feature pitch $P'_1$), and an uppermost lower metallization layer (e.g., $M'_2$) having a second metallization feature pitch (e.g., $P'_2$), larger than the first metallization feature pitch. Metallization layers 215 include a metallization layer (e.g., $M_4$) having a metallization feature pitch compatible with $P'_2$, and a metallization layer (e.g., $M_1$) having a metallization feature pitch smaller than $P_2$ (e.g., $P_1$).

Returning to FIG. 1, methods 101 may continue with one or more subsequent iterations of blocks 105, 115, 120, 125, 130 and 135 before methods 101 are terminated and the resulting composite IC chip singulated and packaged. With each iteration of methods 101, the composite IC chip structure may be augmented with one or more chiplets bonded at higher BEOL metallization levels. For the example further illustrated in FIG. 5, during a second iteration of blocks 105 and 115 conductive features 517 of a chiplet 501 are directly bonded to conductive features 330 in an upper metallization layer ($M'_5$). As conductive features 330 have a pitch compatible with conductive via pitch $P'_4$, conductive features 517 may have a feature pitch that is significantly larger than feature pitch $P'_2$. Chiplet 501 may therefore either include more metallization layers than chiplet 201 to incrementally scale to accommodate pitch $P'_4$, or design rules of the one or more metallization levels of chiplet 501 may be relaxed relative to those of chiplet 201 to accommodate pitch $P'_4$.

Figure 5:
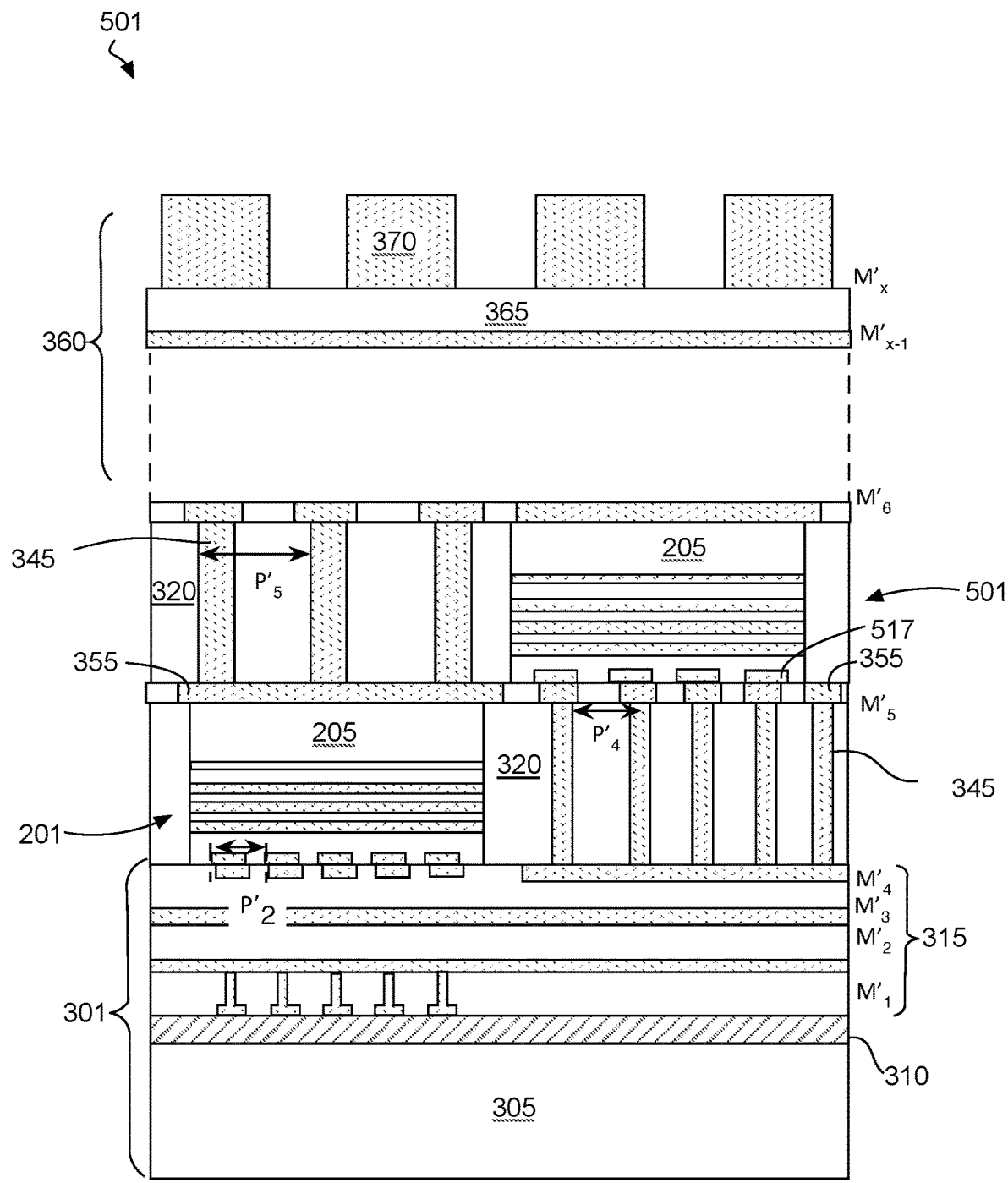

As further illustrated in FIG. 5, another layer of dielectric material 320 is over chiplet 201. Chiplet 201 and dielectric material 320 have been polished/ground back to some planarized target thickness, for example substantially as described above. Additional conductive vias 345 extend through dielectric material 320 and intersect upper metallization layer 355. Additional upper metallization layers 360 (e.g., $M'_6$, $M'_{x-1}$, $M'_x$) may be over chiplet 201, for example as formed during a second iteration of block 135 (FIG. 1) that further includes the formation of FLI interface features 370 (FIG. 5).

Figure 6A:
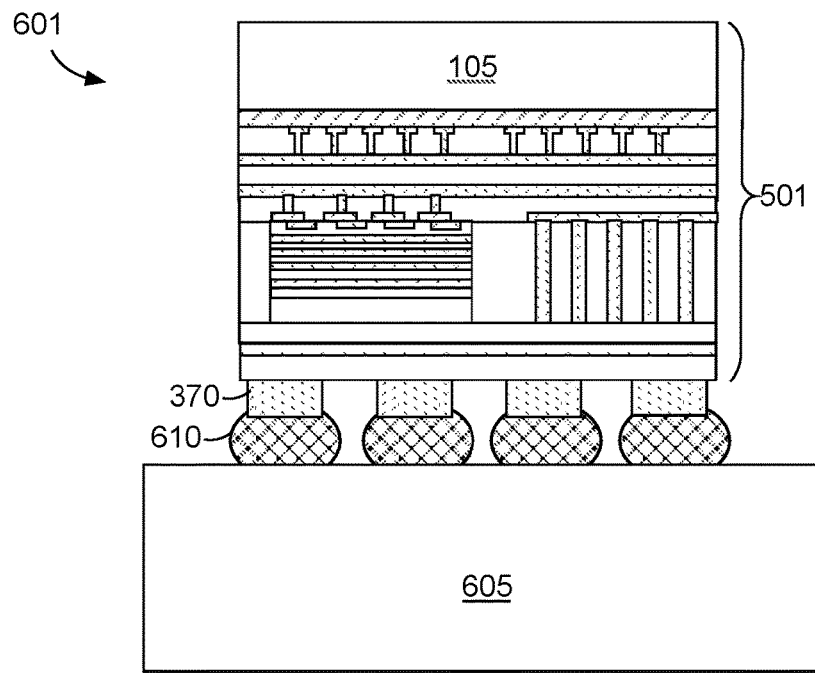
FIGS. 6A and 6B illustrate packaged IC devices that include a composite IC chip structure, in accordance with some embodiments.

Upon completing the fabrication of a composite IC chip, the composite IC chip may be packaged and/or interconnected to any host component to which any monolithic IC chip may be attached. FIG. 6A illustrates an exemplary packaged IC device 601 that includes composite IC chip structure 501, in accordance with some embodiments. Composite chip structure 501 is attached by solder FLI features 610 to a host component 605, which may be any interposer or package substrate, for example. Solder FLI features 610 are in contact with FLI interfaces 370 on the composite IC chip side, and may be in contact with any suitable host-side FLI interface (not depicted). Solder FLI features 610 may be of any composition (e.g., SAC) and applied by any technique. Non-solder embodiments are also possible where FLI interfaces 370 are directly bonded (e.g., Cu—Cu bumps) to host component 605. In some embodiments, host component 605 is predominantly silicon. Other materials known to be suitable as interposers or package substrates may also be employed as host component 605 (e.g., an epoxy preform, etc.). Host component 605 may include one or more metallized redistribution levels (not depicted) embedded within a dielectric material. Host component 605 may also include one or more chiplets embedded therein. For example, a chiplet (not depicted) may be embedded within the metallized redistribution levels of host component 605.

Figure 6B:
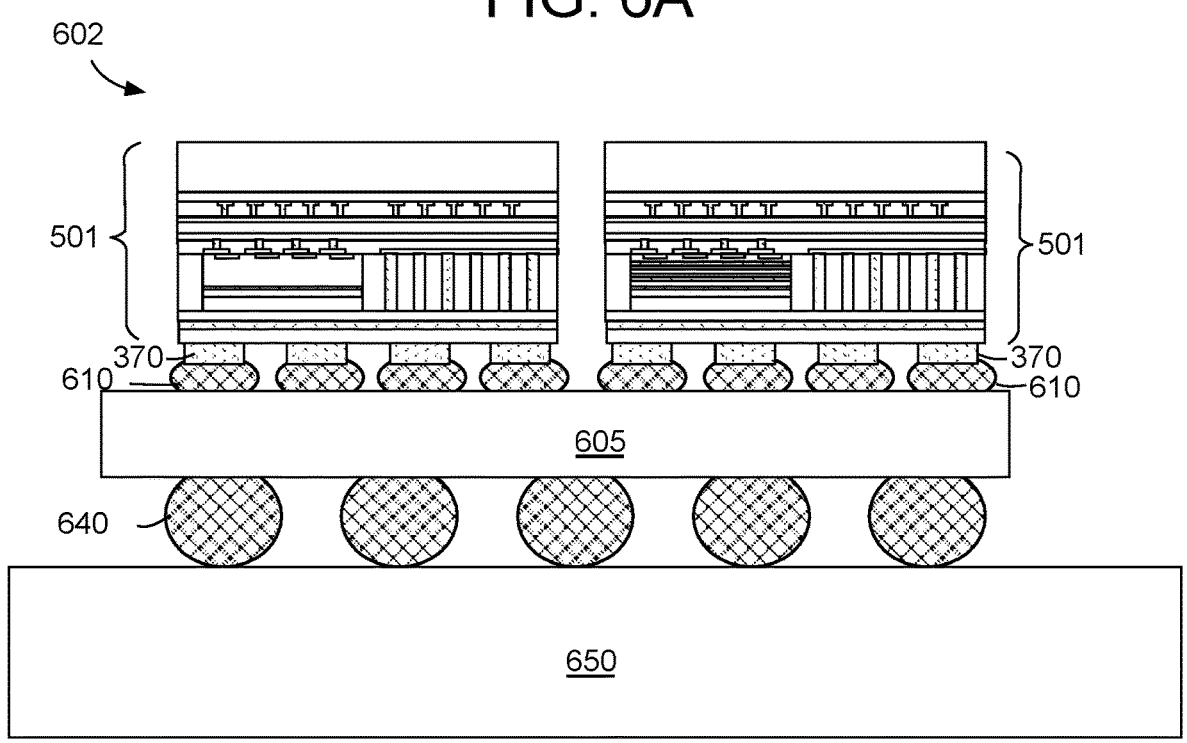

FIG. 6B illustrates an exemplary microelectronic system 602 that includes a plurality of composite IC chips 501 that are further integrated together into a multi-chip assembly sharing a single host component 605. As shown, host component 605 (e.g., a package substrate) is coupled to composite chip structures 501 by FLI interconnects 610, and is further coupled to a host board 650 by second level interconnects (SLI) 640. SLI 640 may comprise any solder (ball, bump, etc.) suitable for a given host board 650 architecture (e.g., surface mount FR4, etc.).

Figure 7:
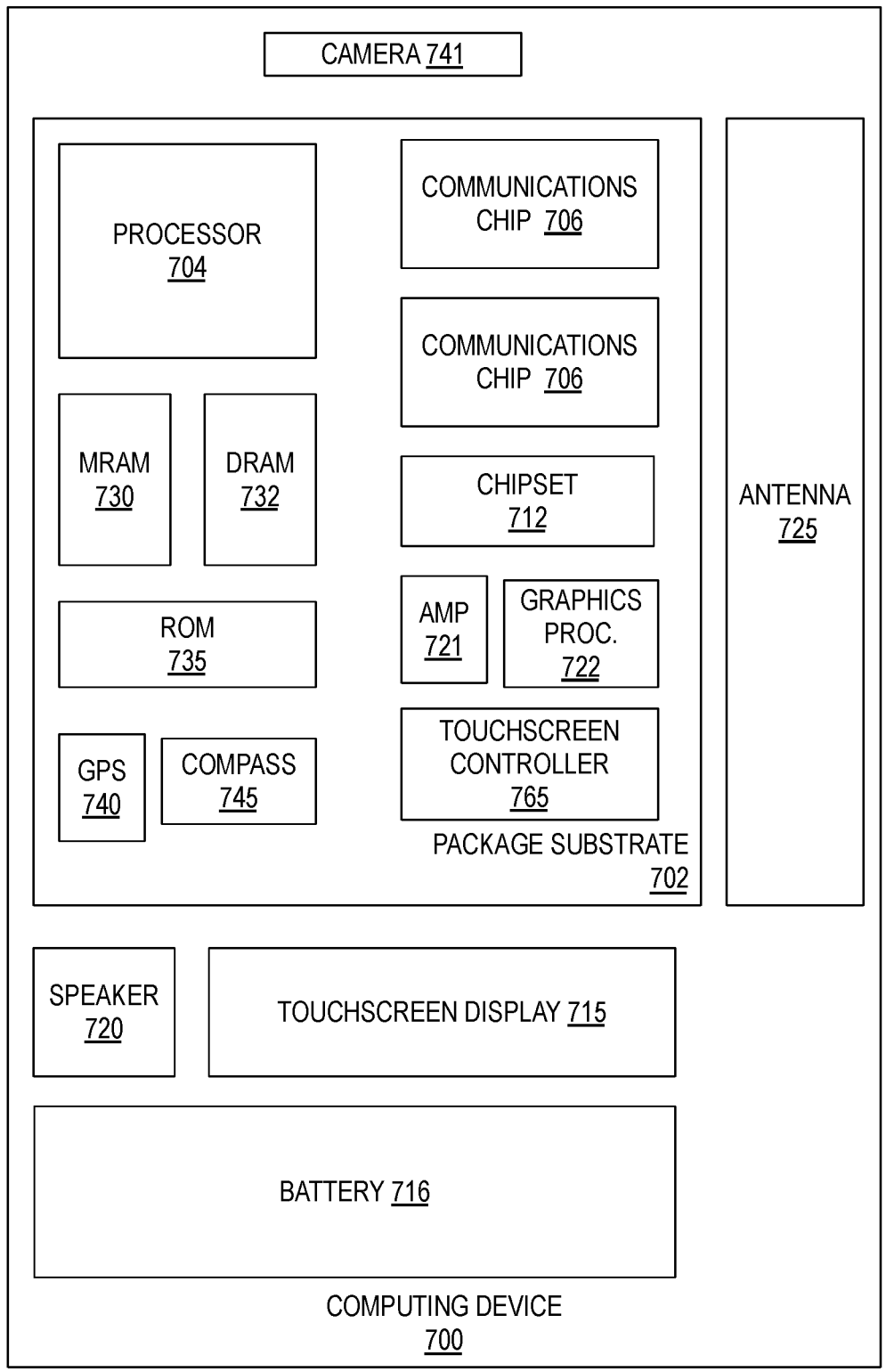
FIG. 7 is a functional block diagram of an electronic computing device, in accordance with some embodiments.

FIG. 7 is a functional block diagram of an electronic computing device 700, in accordance with an embodiment of the present invention. Device 700 further includes a package substrate 702 hosting a number of components, such as, but not limited to, a processor 704 (e.g., an applications processor). Processor 704 may be physically and/or electrically coupled to package substrate 702. In some examples, processor 704 is within a composite IC chip structure including a chiplet bonded to a host IC chip, for example as described elsewhere herein. Processor 704 may be implemented with circuitry in either or both of the host IC chip and chiplet. In general, the term "processor" or "microprocessor" may refer to any device or portion of a device that processes electronic data from registers and/or memory to transform that electronic data into other electronic data that may be further stored in registers and/or memory.

In various examples, one or more communication chips 706 may also be physically and/or electrically coupled to the package substrate 702. In further implementations, communication chips 706 may be part of processor 704. Depending on its applications, computing device 700 may include other components that may or may not be physically and electrically coupled to package substrate 702. These other components include, but are not limited to, volatile memory (e.g., DRAM 732), non-volatile memory (e.g., ROM 735), flash memory (e.g., NAND or NOR), magnetic memory (MRAM 730), a graphics processor 722, a digital signal processor, a crypto processor, a chipset 712, an antenna 725, touchscreen display 715, touchscreen controller 765, battery 716, audio codec, video codec, power amplifier 721, global positioning system (GPS) device 740, compass 745, accelerometer, gyroscope, speaker 720, camera 741, and mass storage device (such as hard disk drive, solid-state drive (SSD), compact disk (CD), digital versatile disk (DVD), and so forth), or the like. In some exemplary embodiments, at two of the functional blocks noted above are within a composite IC chip structure including a chiplet bonded to a host IC chip, for example as described elsewhere herein. For example processor 704 be implemented with circuitry in a first of the host IC chip and chiplet, and an electronic memory (e.g., MRAM 730 or DRAM 732) may be implemented with circuitry in a second of the host IC chip and chiplet.

Communication chips 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols. As discussed, computing device 700 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

Figure 8:
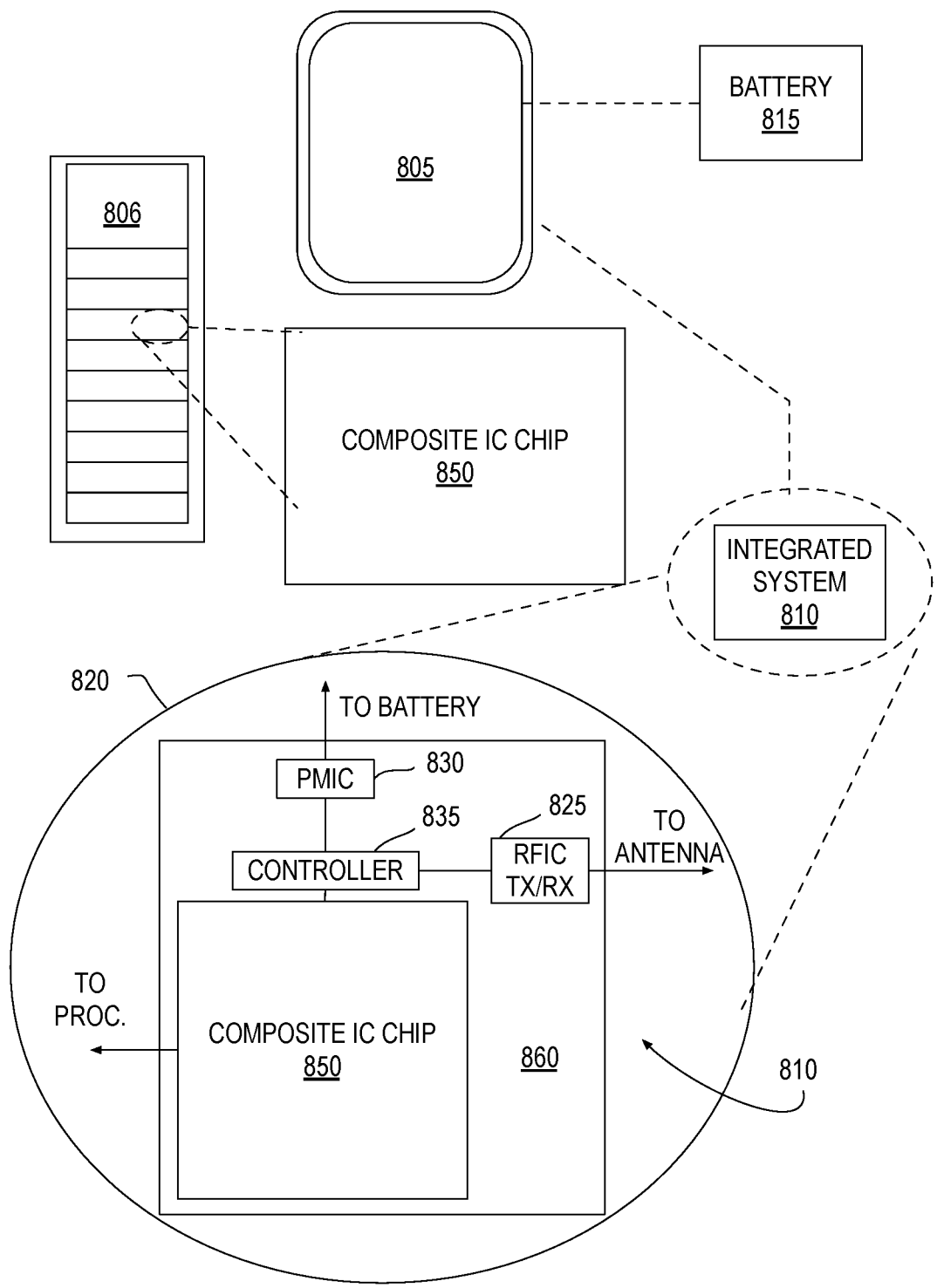
FIG. 8 illustrates a mobile computing platform and a data server machine employing a composite IC chip structure, in accordance with some embodiments.

FIG. 8 illustrates a mobile computing platform and a data server machine employing a composite IC chip structure, for example as described elsewhere herein. Computing device 700 may be found inside platform 805 or server machine 806, for example. The server machine 806 may be any commercial server, for example including any number of high-performance computing platforms disposed within a rack and networked together for electronic data processing, which in the exemplary embodiment includes a composite IC chip 850 that includes a chiplet bonded to a host IC chip, for example as described elsewhere herein. The mobile computing platform 805 may be any portable device configured for each of electronic data display, electronic data processing, wireless electronic data transmission, or the like. For example, the mobile computing platform 805 may be any of a tablet, a smart phone, laptop computer, etc., and may include a display screen (e.g., a capacitive, inductive, resistive, or optical touchscreen), a chip-level or package-level integrated system 810, and a battery 815.

Whether disposed within the integrated system 810 illustrated in the expanded view 820, or as a stand-alone package within the server machine 806, composite IC chip 850 may include a chiplet bonded to a host IC chip, for example as described elsewhere herein. Composite IC chip 850 may be further coupled to a host substrate 860, along with, one or more of a power management integrated circuit (PMIC) 830, RF (wireless) integrated circuit (RFIC) 825 including a wideband RF (wireless) transmitter and/or receiver (TX/RX) (e.g., including a digital baseband and an analog front end module further comprises a power amplifier on a transmit path and a low noise amplifier on a receive path), and a controller 835. PMIC 830 may perform battery power regulation, DC-to-DC conversion, etc., and so has an input coupled to battery 815 and with an output providing a current supply to other functional modules. As further illustrated, in the exemplary embodiment, RFIC 825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, and beyond.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) device structure comprises a host chip comprising a first device layer and one or more lower metallization layers interconnected to transistors of the first device layer. The device structure comprises a chiplet comprising a second device layer and one or more chiplet metallization layers interconnected to transistors of the second device layer. The device structure comprises a top metallization layer comprising a plurality of first level interconnect (FLI) interfaces. The chiplet is embedded between a first region of the first device layer and the top metallization layer, and the top metallization layer extends over a second region of the first device layer, beyond an edge of the chiplet In second examples, in any of the first embodiments a first feature of one of the lower metallization layers is in direct contact with a second feature of one of the chiplet metallization layers In third examples, for any of the second examples the first feature has a first area and the second feature has a second area, and wherein the first feature is laterally offset from the second feature with only a portion of the first area that overlaps the second area in contact with the second area.

In fourth examples, for any of the second or third examples a first dielectric material that is around the first feature is in direct contact with a second dielectric material that is around the second feature.

In fifth examples, for any of the second through fourth examples, an interdiffused metallurgical bond joins the first feature to the second feature.

In sixth examples, for any of the first through fifth examples, the structure further comprises a dielectric material over the second region of the host chip and adjacent to the edge of the chiplet. The top metallization layer is interconnected through the dielectric material to one of the lower metallization layers.

In seventh examples, for any of the sixth examples the top metallization layer is interconnected to one of the lower metallization layers through the dielectric material by one or more conductive vias.

In eighth examples, for any of the seventh examples misregistration of the conductive vias and a first feature of one of the lower metallization layers is smaller than a lateral offset between a second feature of one of the lower metallization layers that is in direct contact with a feature of one of the chiplet metallization layers.

In ninth examples, for any of the seventh through eighth examples the dielectric material has a thickness that is substantially equal to a thickness of the chiplet.

In tenth examples, for any of the first through ninth examples the chiplet has a thickness less than 80 µm.

In eleventh examples, for any of the first through tenth examples the lower metallization layers comprise a first metallization layer having a first metallization feature pitch, and a second metallization layer having a second metallization feature pitch, larger than the first metallization feature pitch. The chiplet metallization layers include a third metallization layer having a third metallization feature pitch, and a fourth metallization layer having a fourth metallization feature pitch, larger than the third metallization feature pitch. One or more features of the fourth metallization layer are in direct contact with one or more features of the second metallization layer.

In twelfth examples, for any of the eleventh examples the first metallization feature pitch is smaller than the fourth metallization feature pitch, and the second metallization feature pitch is smaller than the third metallization feature pitch.

In thirteenth examples, for any of the first through twelfth examples the chiplet is a first chiplet, and the structure further comprises a second chiplet embedded between the top metallization layer and the second region of the first device layer. The second chiplet comprises a third device layer and one or more second chiplet metallization layers interconnected to transistors of the third device layer. The structure further comprises a dielectric material over the second chiplet and adjacent to a sidewall of the second chiplet.

In fourteenth examples, for any of the thirteenth examples a feature of one of the second chiplet metallization layers is electrically coupled to one of the lower metallization layers by one or more vias extending through a dielectric material that is adjacent to an edge sidewall of the first chiplet.

In fifteenth examples, a system comprises a microprocessor, and a memory coupled to the microprocessor. At least one of the memory or the microprocessor comprises circuitry on a host chip comprising a first device layer and one or more lower metallization layers interconnected to transistors of the first device layer. The system further comprises a chiplet comprising a second device layer and one or more chiplet metallization layers interconnected to transistors of the second device layer. The system further comprises a top metallization layer comprising a plurality of first level interconnect (FLI) interfaces. The chiplet is embedded between a first region of the first device layer and the top metallization layer, and the top metallization layer extends over a second region of the first device layer, beyond an edge of the chiplet.

In sixteenth examples, for any of the fifteenth examples a first of the memory and the microprocessor comprises circuitry on the host chip, and a second of the memory and the microprocessor comprises circuitry on the chiplet.

In seventeenth examples, for any of the fifteenth through sixteenth examples the chiplet comprises at least one of wireless radio circuitry, floating point gate array (FPGA) circuitry, power management circuitry, active repeater circuitry, clock generator circuitry, temperature sensing circuitry, or ESD protection circuitry.

In eighteenth examples, a method for fabricating an IC device structure comprises forming a lower metallization layer over a first and second region of a first device layer. The method comprises bonding a chiplet over the first region of the first device layer, the chiplet comprising a second device layer. The method comprises forming a top metallization layer over the chiplet and over the second region of the first device layer, wherein the top metallization layer comprises a plurality of first level interconnect (FLI) interfaces.

In nineteenth examples, for any of eighteenth examples the method comprises forming a dielectric material over the chiplet and over the second region of the first device layer. The method comprises planarizing the dielectric material with a surface of the chiplet. The mehthod comprises forming one or more conductive vias through the dielectric material. The method comprises forming the top metallization layer over the one or more conductive vias.

In twentieth examples, for any of the eighteenth through nineteenth examples the chiplet includes at least one chiplet metallization layer, and bonding the chiplet to the first region further comprises bonding a feature of the lower metallization layer to a feature of the chiplet metallization layer.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should therefore be determined with reference to the appended claims, along with the full scope of equivalents to which such claims are entitled.

What is claimed is:

1. An integrated circuit (IC) device structure, comprising:
   a host chip comprising one or more lower metallization layers and a first device layer, wherein at least one of the lower metallization layers is interconnected to transistors of the first device layer;
   a chiplet comprising one or more chiplet metallization layers and a second device layer, wherein at least one of the chiplet metallization layers is interconnected to transistors of the second device layer; and
   a top metallization layer comprising a plurality of first level interconnect (FLI) interfaces, wherein the chiplet is embedded between a first region of the first device layer and the top metallization layer, and wherein the top metallization layer extends over a second region of the first device layer, beyond an edge of the chiplet.

2. The IC device structure of claim 1, wherein at least a portion of a first feature of one of the lower metallization layers is in direct contact with at least a portion of a second feature of one of the chiplet metallization layers.

3. The IC device structure of claim 2, wherein the first feature has a first area and the second feature has a second area, and wherein the first feature is laterally offset from the second feature.

4. The IC device structure of claim 2, wherein a first dielectric material that is around the first feature is in direct contact with a second dielectric material that is around the second feature.

5. The IC device structure of claim 4, wherein an inter-diffused metallurgical bond joins the first feature to the second feature.

6. The IC device structure of claim 1, further comprising a dielectric material over the second region of the host chip and adjacent to the edge of the chiplet, wherein the top metallization layer is interconnected through the dielectric material to at least one of the lower metallization layers.

7. The IC device structure of claim 6, wherein the top metallization layer is interconnected to at least one of the lower metallization layers through the dielectric material by one or more conductive vias.

8. The IC device structure of claim 7, wherein misregistration of the conductive vias and a first feature of one of the lower metallization layers is smaller than a lateral offset between a second feature of one the lower metallization layers that is in direct contact with a feature of one of the chiplet metallization layers.

9. The IC device structure of claim 7, wherein the dielectric material has a thickness that is substantially equal to a thickness of the chiplet.

10. The IC device structure of claim 9, wherein the chiplet has a thickness less than 80 μm.

11. The IC device structure of claim 1, wherein
    the lower metallization layers comprise a first metallization layer having a first metallization feature pitch, and a second metallization layer having a second metallization feature pitch, larger than the first metallization feature pitch;
    the chiplet metallization layers include a third metallization layer having a third metallization feature pitch, and a fourth metallization layer having a fourth metallization feature pitch, larger than the third metallization feature pitch; and
    one or more features of the fourth metallization layer are in direct contact with one or more features of the second metallization layer.

12. The IC device structure of claim 11, wherein the first metallization feature pitch is smaller than the fourth metallization feature pitch, and the second metallization feature pitch is smaller than the third metallization feature pitch.

13. The IC device structure of claim 1, wherein the chiplet is a first chiplet and the structure further comprises:
    a second chiplet embedded between the top metallization layer and the second region of the first device layer, wherein the second chiplet comprises one or more second chiplet metallization layers and a third device layer, wherein at least one of the second chiplet metallization layers is interconnected to transistors of the third device layer; and
    a dielectric material over the second chiplet and adjacent to a sidewall of the second chiplet.

14. The IC device structure of claim 13, wherein a feature of one of the second chiplet metallization layers is electrically coupled to at least one of the lower metallization layers by one or more vias extending through a dielectric material that is adjacent to an edge sidewall of the first chiplet.

15. A system comprising:
    a microprocessor; and
    a memory coupled to the microprocessor, wherein at least one of the memory or the microprocessor comprises circuitry on a host chip comprising one or more lower metallization layers and a first device layer, wherein at least one of the one or more lower metallization layers is interconnected to transistors of the first device layer, and wherein the system further comprises:
    a chiplet comprising one or more chiplet metallization layers and a second device layer, wherein at least one of the chiplet metallization layers is interconnected to transistors of the second device layer; and
    a top metallization layer comprising a plurality of first level interconnect interfaces, wherein the chiplet is embedded between a first region of the first device layer and the top metallization layer, and wherein the top metallization layer extends over a second region of the first device layer, beyond an edge of the chiplet.

16. The system of claim 15, wherein a first of the memory and the microprocessor comprises circuitry on the host chip, and a second of the memory and the microprocessor comprises circuitry on the chiplet, and wherein the system further comprises a plurality of first level interconnects coupled between the first level interconnect interfaces and a host substrate.

17. The system of claim 15, wherein the chiplet comprises at least one of wireless radio circuitry, floating point gate array (FPGA) circuitry, power management circuitry, active repeater circuitry, clock generator circuitry, temperature sensing circuitry, or ESD protection circuitry.

18. A method for fabricating an IC device structure, the method comprising:
    forming a lower metallization layer over a first region and a second region of a first device layer;
    bonding a chiplet over the first region of the first device layer, the chiplet comprising a second device layer; and
    forming a top metallization layer over the chiplet and over the second region of the first device layer, wherein the top metallization layer comprises a plurality of first level interconnect (FLI) interfaces.

19. The method of claim 18, further comprising:
    forming a dielectric material over the chiplet and over the second region of the first device layer;
    planarizing the dielectric material to a surface of the chiplet;

forming one or more conductive vias through the dielectric material; and forming the top metallization layer over the one or more conductive vias.

20. The method of claim 18, wherein the chiplet includes at least one chiplet metallization layer, and bonding the chiplet to the first region further comprises bonding a feature of the lower metallization layer to a feature of the chiplet metallization layer.

* * * * *